United States Patent [19]

Aiki et al.

[11] Patent Number: 4,920,262

[45] Date of Patent: Apr. 24, 1990

[54] PHOTOELECTRIC DEVICE WITH LEADS

[75] Inventors: Kunio Aiki; Atsushi Sasayama; Tugio Nemoto; Makoto Haneda, all of Komoro; Satoru Ishii, Tamamura; Haruo Kugimiya, Komoro; Tutomu Kawasaki, Tsuchiura, all of Japan

[73] Assignees: Hitachi, Ltd., Tokyo; Hitachi Tobu Semiconductor, Saitama, both of Japan

[21] Appl. No.: 305,542

[22] Filed: Feb. 3, 1989

Related U.S. Application Data

[62] Division of Ser. No. 54,392, May 26, 1987, Pat. No. 4,803,361.

[30] Foreign Application Priority Data

| May 26, 1986 | [JP] | Japan | 61-119235 |
| May 26, 1986 | [JP] | Japan | 61-119234 |
| May 26, 1986 | [JP] | Japan | 61-119233 |
| May 26, 1986 | [JP] | Japan | 61-119236 |
| May 26, 1986 | [JP] | Japan | 61-119219 |

[51] Int. Cl.$^5$ .............................................. H01J 5/16
[52] U.S. Cl. ................................ 250/227.11; 350/96.2
[58] Field of Search ............... 350/96.21, 96.17, 96.2; 250/227

[56] References Cited

U.S. PATENT DOCUMENTS

| 4,233,619 | 11/1980 | Webb et al. | 350/96.2 |
| 4,296,998 | 10/1981 | Dufft | 350/96.2 |
| 4,439,006 | 3/1984 | Stevenson | 350/96.2 |
| 4,440,470 | 4/1984 | Khoe | 350/96.2 |
| 4,523,802 | 6/1985 | Sakaguchi et al. | 350/96.2 |
| 4,623,220 | 11/1986 | Grabbe et al. | 350/96.2 |
| 4,627,687 | 12/1986 | Dorn et al. | 350/96.2 |
| 4,702,556 | 10/1987 | Ishii et al. | 350/96.2 |
| 4,707,067 | 11/1987 | Haberland et al. | 350/96.2 |
| 4,807,956 | 2/1989 | Tournereau et al. | 350/96.2 |

*Primary Examiner*—David C. Nelms
*Assistant Examiner*—Michael Messinger
*Attorney, Agent, or Firm*—Antonelli, Terry & Wands

[57] ABSTRACT

In a photoelectric device, particularly, a photoelectric device for optical communication, an optical fiber is fixed at two fixing points so that the extremity of the optical fiber is disposed opposite to the light emitting surface of a laser diode chip and the optical fiber extends in a nonlinear shape, for example, in a moderate curve, between the two fixing points. Even though holding members fixedly holding the optical fiber at the two fixing points and a base member supporting the holding members are formed of a metal or metals having a coefficient of thermal expansion far greater than that of the optical fiber, and even if the distance between the two fixing points is varied due to the thermal expansion or contraction of the holding members and the base member, the optical fiber is obliged only to change the shape of extension. Therefore, the optical fiber and the solder fixing the optical fiber to the holding members at the two fixing points are not subjected to repeated stress, and hence the fatigue of the optical fiber and the solder is avoided. Accordingly, the photoelectric device is able to continue stable optical communication regardless of temperature variation. Terminals are formed by leads having an inductance reducing thick portion that are connected to the photoelectric device inside a box-shaped housing. A thinner lead conforming to the prevailing standard connector is connected to the thick lead using ultrasonic bonding at a position outside of the housing.

12 Claims, 11 Drawing Sheets

PHOTOELECTRIC DEVICE WITH LEADS

This is a division of application Ser. No. 054,392, filed May 26, 1987 now U.S. Pat. No. 4,803,361.

BACKGROUND OF THE INVENTION

The present invention relates to a photoelectric device and, more specifically, to a photoelectric device having a package containing a laser chip which emits laser light, and an optical fiber cable which guides the laser light emitted from the laser chip outside the package.

A semiconductor laser device is used as a light source for the optical communication system. An exemplary laser module, namely, a semiconductor laser device, for the optical communication system is published in "Hitachi Hyoron", Hitachi Hyoron Sha, No. 10, pp. 39-44, Oct., 1983. This semiconductor laser device is of a so-called direct disposition system, in which the free end of the optical fiber is disposed opposite to the resonant end face of the semiconductor laser element, and is formed in a flat module having a box-shaped package. This semiconductor laser device has a metallic stem with the central portion of the main plane thereof sealed by a cap formed of a metallic plate and is provided internally with a semiconductor laser element (laser diode chip) and a light receiving element which detects the optical output of laser light emitted from the resonant end face of the laser diode chip. Further, this semiconductor laser device employs a laser diode chip which emits a laser light of a 1.3 $\mu$m band, and a single-mode optical fiber for long-distance large-capacity communication. In this semiconductor laser device, the free end of the optical fiber facing the light emitting surface of the laser diode chip are supported on a positioning shaft, which is bent to adjust the position of the free ends of the optical fiber for optical axis alignment.

The applicant of this patent application has proposed a technique to improve the efficiency of the optical connection of the laser diode chip and the optical fiber of a semiconductor laser device in Japanese Patent Application No. 58-151560. According to this technique, the free end of the optical fiber is held by a flexible holder, and an external force is applied to the head of the flexible holder after fixing the optical fiber and the laser diode chip to adjust the position of the free ends of the optical fiber so that the respective optical axis of the optical fiber and the laser diode chip are aligned with each other.

A light emitting module for optical communication is published in "NEC Giho", Vol. 38, No. 2, pp. 84-89, 1985. This light emitting module comprises, in a package, a laser element which emits a laser light, a Ge-PD (light receiving element) for monitoring the back radiation of the laser element, a thermistor for monitoring the temperature of the laser element, and a Peltier element functioning as a temperature regulating cooler; an optical fiber cable for transmitting the laser light outside the package is connected to the package. The light emitting module is a dual in line package. The laser element and the thermistor are mounted on a block fixed on the Peltier element, while the optical fiber is secured to the block. The light receiving element is fixed to the block.

In either foregoing semiconductor laser device, the optical fiber is disposed with the free end thereof opposite the laser diode chip and are held fixedly at a position near the wall of the package and at a position near the laser diode so as to extend linearly between the two positions.

SUMMARY OF THE INVENTION

As is described in the cited papers, to enable a semiconductor laser device to function fully and stably as a component of an optical communication equipment, it is essential to align the respective optical axes of the laser diode chip and the optical fiber at a high accuracy and to maintain the configuration of the parts, which are positioned at a high accuracy, for an extended period of time.

In the conventional semiconductor laser device, the optical fiber is held fixedly at a position near the laser diode chip and at a position near the wall of the package so that the optical fiber will extend linearly between the two positions. Since the optical fiber is formed of quartz having a coefficient of thermal expansion which is far smaller than that of metals forming holding members holding the optical fiber at the two positions, the optical fiber linearly extended between the two position is unable to follow the variation of the distance between the two positions attributable to temperature variation when the distance between the two positions is as small as several millimeters to several tens millimeters. It has been found by the inventors of the present invention that, since the optical fiber is unable to follow the variation of the distance between the two holding positions, the optical fiber or the solder fixing the optical fiber is subjected to repeated stress and thereby the solder is caused to fracture and the optical fiber is caused to break by buckling. Since the fatigue fracture of the solder make the solder unable to hold the optical fiber securely, the free end of the optical fiber is dislocated to deteriorate the optical connection of the optical fiber and the laser diode chip making optical communication impossible. Optical communication is obliged to be interrupted also by the buckling of the optical fiber.

Furthermore, the disposition of the light receiving element for monitoring the laser light, and the thermistor for temperature detection also is important to enable all the parts to exhibit their full functions. Moreover, since those parts which need to be assembled at a high accuracy are very small, a technique for integrally assembling those very small parts in a module is important in respect of the improvement of the reliability of the semiconductor laser device, productivity of the production line and yield, and the reduction of the manufacturing cost of the semiconductor laser device.

On the other hand, as is described in the cited papers, a technique for aligning the optical axes to enable the optical fiber to efficiently receive the laser light emitted from the light emitting surface of the laser diode chip is very important to improve the reliability of the semiconductor laser device and the yield of the manufacturing process.

As is further described in the cited papers, leads of 0.45 mm in diameter are arranged on the bottom wall of the package to construct a dual in line package. In such a semiconductor laser device, the leads penetrate the bottom wall of the package and hence the length of each lead extending from the bottom wall is large. The inventors of the present invention have found that such a lead vibrates in connecting a wire to the upper end of the lead through ultrasonic bonding to the upper end of the lead, and thereby the wire is unable to be connected to the upper end of the lead satisfactorily. The inventors found a further disadvantage of such a long lead that an increased parasitic inductance of the long lead deteriorates the high-frequency band characteristics.

As is described in the cited paper, Hitachi Hyoron, also important is a technique for aligning the respective optical axes of the laser diode chip and the optical fiber to secure the satisfactory optical connection of the laser diode chip and the optical fiber. To maintain the optical connection as assembled, the optical fiber needs to be fixed near the free end thereof. Generally, solder, which does not produce any gas, is used as a bonding material for fixing the optical fiber, to enhance the reliability of the semiconductor laser device.

The inventors of the present invention have found that, in some cases, the optical fiber correctly positioned relative to the laser diode chip is dislocated in fixing the optical fiber to a holding member by soldering. Generally, the holding members holding the optical fiber and the laser diode chip, and a base supporting those holding members are formed of metals, respectively. Accordingly, in soldering the optical fiber to the holding member, the holding member is heated locally and the heat is transferred from the holding member to the base making the holding member unable to be heated to a temperature necessary for soldering. Furthermore, since the soldering heat is transferred to the base to heat the peripheral parts causing the thermal expansion and deformation of those peripheral parts, so that the disposition of the laser diode and the optical fiber is varied causing the deterioration of the alignment of the respective optical axes of the laser diode chip and the optical fiber, which has been adjusted previous to soldering. If the optical fiber is thus fixed with their optical axes in misalignment with the optical axis of the laser diode chip, the efficiency of the optical connection of the laser diode and the optical fiber is reduced, and hence the semiconductor device cannot be used, and reassembling the faultily assembled semiconductor laser device requires troublesome work.

It is therefore a first object of the present invention to provide a photoelectric device the efficiency of the optical connection of which is not affected by temperature variation.

It is a second object of the present invention to provide a photoelectric device having an optical fiber and optical fiber fastening parts which are not damaged even when subjected to temperature variation.

It is a third object of the present invention to provide a technique for aligning optical axes at high accuracy.

It is a fourth object of the present invention to provide a photoelectric device having high reliability.

It is a fifth object of the present invention to provide a highly productive technique for manufacturing a photoelectric device.

It is a sixth object of the present invention to provide a technique for manufacturing a photoelectric device at a reduced manufacturing cost.

It is a seventh object of the present invention to provide electronic parts of constructions which enable reliable ultrasonic bonding.

It is an eighth object of the present invention to provide electronic parts of constructions reducing the parasitic inductances of the leads and the like.

It is a ninth object of the present invention to provide electronic parts capable of functioning in high-frequency bands.

It is a tenth object of the present invention to provide electronic parts of constructions permitting efficient local heating in a short time.

It is an eleventh object of the present invention to provide a semiconductor laser device of a construction capable of being assembled without spoiling the efficiency of optical connection secured in a preparatory assembling process.

The above and other objects, features and advantages of the present invention will become apparent from the following description taken in conjunction with the accompanying drawings.

DESCRIPTION OF THE PREFERRED EMBODIMENTS

Figure 1:
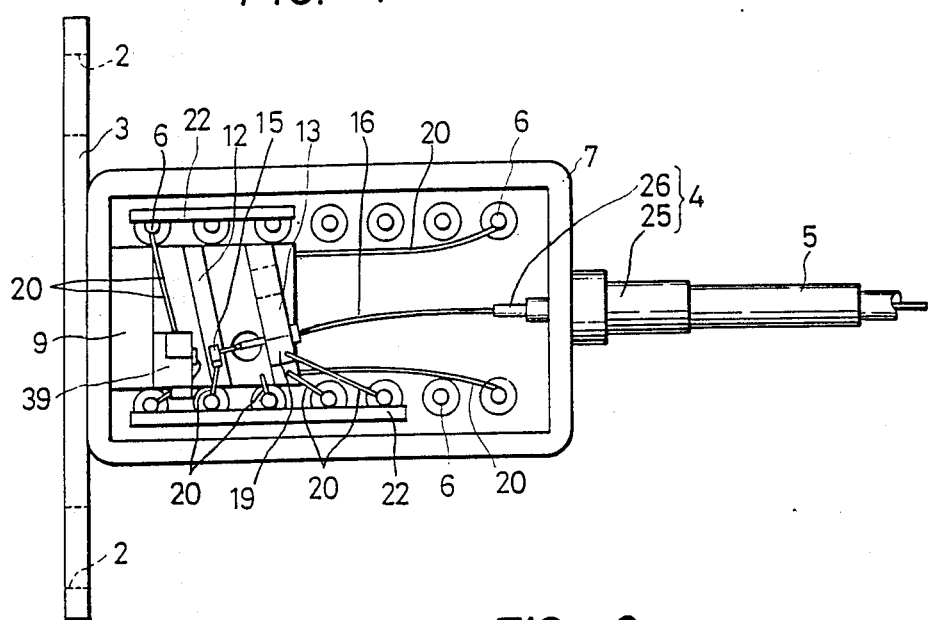
FIG. 1 is a plan view showing the essential portion of a photoelectric device, in a first embodiment, according to the present invention.

A photoelectric device, in a first embodiment, according to the present invention will be described with reference to FIGS. 1 through 15 as applied to an originating device incorporating a laser diode chip which emits a laser light of 1.3 or 1.5 µm in wavelength, for use in optical communication systems.

Referring to FIGS. 1 to 4, the photoelectric device has a box-shaped package 1. The package 1 has one end provided with a flange 3 having through holes 2 for receiving fastening members for fastening the package 1 and the other end provided with a fiber guide 4 for guiding an optical cable 5. The photoelectric device is of a dual in line construction having leads 6 arranged in two rows and penetrating the bottom wall of the package 1. The package 1 consists of a box-shaped package body 7 having an upper opening and a lid 8 hermetically covering the upper opening of the package body 7. A base plate 9 is fixed to the upper surface of the bottom wall of the package body 7; a Peltier element 10 is mounted fixedly on the base plate 9; a subcarrier 11 is mounted fixedly on the Peltier element 10. The subcarrier 11 comprises a heat sink 14 having a holding part 12 and a supporting part 13 rising from the main surface thereof, a laser diode chip 15 held on the holding part 12, a tubular positioning and fixing member 17 for positioning and fixing a optical fiber 16 which receives the laser light emitted from the laser diode chip 15, a light receiving element 18 for monitoring the laser light, and a thermistor 19 for monitoring the temperature of the heat sink 14. In the package 1, the jacket of the optical fiber cable 5 is removed to expose the optical fiber 16 each having a core and a cladding enclosing the core. The free end of the exposed optical fibers 16 is held by the positioning and fixing member 17 so as to be disposed opposite to one of the light emitting faces of the laser diode chip 15. The respective electrodes of the elements are connected to the corresponding leads 6 by conductive wires 20, respectively. In this photoelectric device, neither a resin nor a soldering flux is filled in the package 1 to obviate the deterioration of the characteristics of the photoelectric device attributable to a resin or a soldering flux.

The laser light emitted from the laser diode chip 15 is transmitted to a desired place through the optical fiber cable 5 for optical communication. The output of the laser diode chip 15 is controlled on the basis of the output of the light receiving element 18 monitoring the laser light for stable optical communication. The Peltier element 10 is controlled on the basis of the output of the thermistor 19 monitoring the temperature of the heat sink 14 so that the laser diode chip 15 is maintained at a fixed temperature for stable optical communication.

Figure 13:
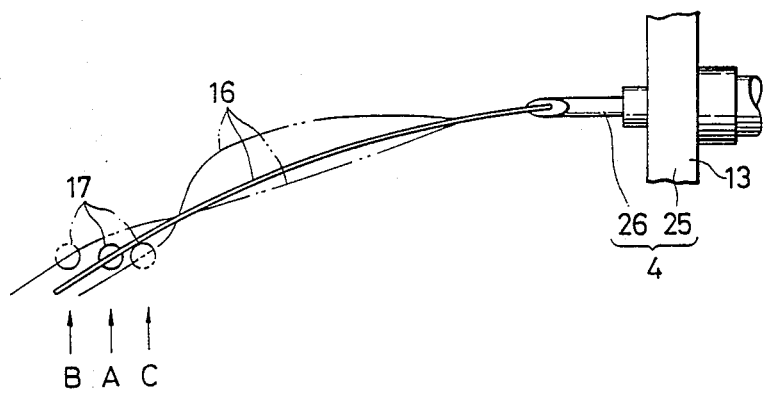
FIG. 13 is a diagrammatic view showing a manner of fastening an optical fiber.

Incidentally, the photoelectric device is characterized in that the optical fiber 16 is extended slack in a moderate curve between the fiber guide 4 attached to one end of the package body 7 and the positioning and fixing member 17 of the subcarrier 11 as illustrated in FIGS. 1 and 13. Fixing members fixing the optical fiber 16 to the subcarrier 11 and to the fiber guide 4 are formed of a metal such as, for example, covar, and the optical fiber 16 is formed of a quartz glass having a coefficient of thermal expansion which is far smaller than those of metals. Therefore, the optical fiber 16 is unable to follow the variation of the distance between the fixing positions attributable to the variation of temperature if the optical fiber 16 is taut between the subcarrier 11 and the fiber guide 4. Consequently, the optical fiber 16 and the solder fixing the optical fiber 16 are subjected to repeated stress, and thereby the optical fiber 16 is buckled and the solder is caused to fracture by fatigue making stable light transmission impossible. When the optical fiber 16 is extended slack in a moderate curve between the fixing positions, the optical fiber 16 is allowed to bend as indicated by an alternate long and short dash line or by an alternate long and two short dashes line in FIG. 13 when one of the fixing positions is shifted toward the fiber guide 4 from a point A to a point C or away from the fiber guide 4 from the point A to a point B, so that the optical fiber 16 is not exposed to an excessive stress and are not damaged. Accordingly, the optical fiber 16 is not subjected to repeated stress and hence the solder fixing the optical fiber 16 is not caused to fracture by fatigue.

The components of the photoelectric device will be described hereinafter. The photoelectric device is assembled by integrating several subassemblies. For example, principal subassemblies are the package body 7 and the subcarrier 11. The subassemblies will be described prior to the description of the general construction of the photoelectric device and a manner of assembling the same.

As mentioned above, the package 1 consists of the box-shaped package body 7 and the flat lid 8, which are formed of Kovar, namely, an iron/nickel/cobalt (Fe/Ni/Co) alloy.

Figure 2:
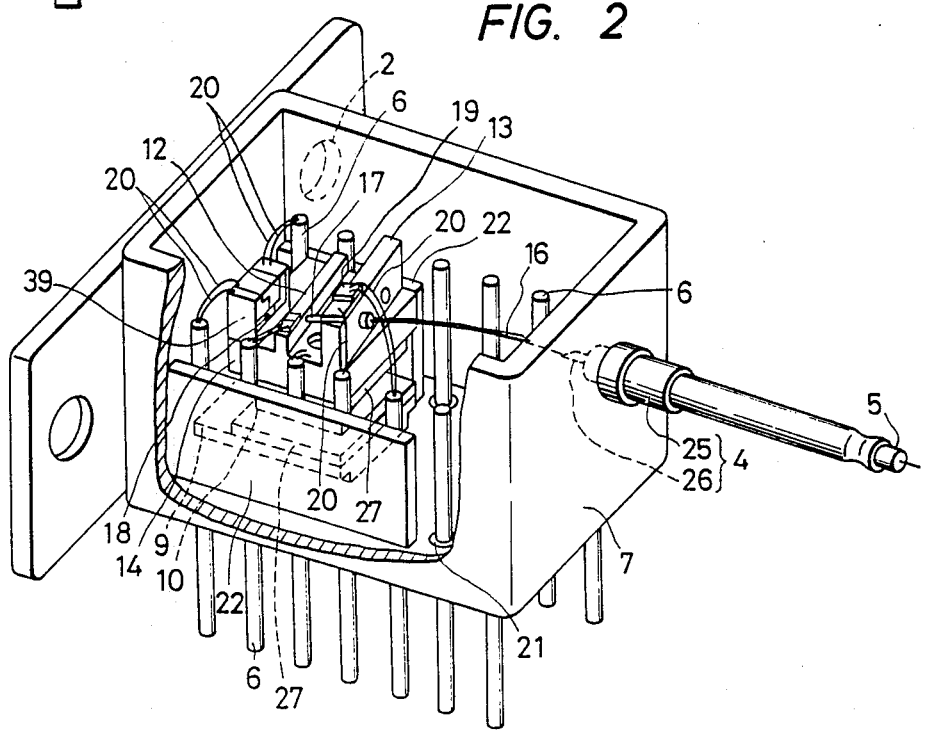
FIG. 2 is a perspective view of the photoelectric device of FIG. 1.
Figure 10:
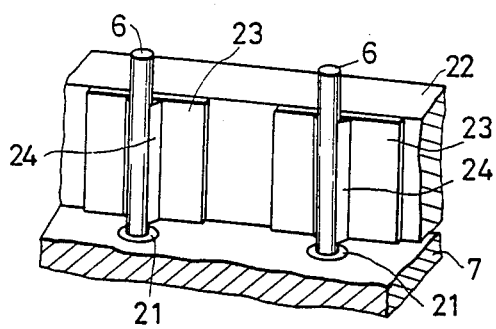
FIG. 10 is an enlarged fragmentary sectional view showing leads and lead reinforcing members.
Figure 9:
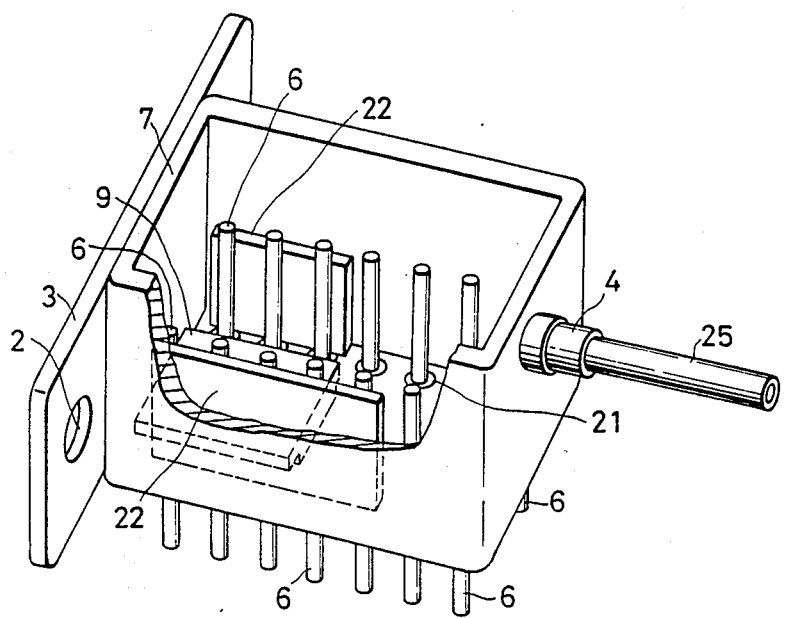
FIG. 9 is a perspective view of a package body.

Referring to FIG. 9, the package body subassembly comprises the package body 7 as a principal component, the flange 3, the fiber guide 4, the leads 6 and the base plate 9. The flange 3 having through holes 2 is attached to one end of the package body 7. The leads 6 are arranged in two rows, for example, seven leads 6 in each row, on the bottom wall of the package body 7 as illustrated in FIG. 10. Each lead 6 penetrates the bottom wall of the package body 7 and is secured to and insulated from the bottom wall of the package body 7 by an insulating fixing material 21 such as, for example, a borosilicate glass. As shown in FIGS. 1 and 2, for example, the respective left end leads 6 of the front and back rows are the external terminals of the light receiving element 18, leads 6 second and third from the left of the front row are the external terminals of the laser diode chip 15, the leads fourth and fifth from the left of the front row are the external terminals of the thermistor 19, the respective right end leads 6 of the front and back row are the external terminals of the Peltier element 10, and the rest of the leads 6 are idle leads which are not used in this embodiment.

Wires 20 are connected to the Peltier element 10 by welding or the like without using a resin or a flux, while the rest of the wires 20 are connected to the leads 6 by ultrasonic bonding. In an ultrasonic bonding process, the wires 20 are bonded to the leads 6 by means of ultrasonic vibrations. Therefore, in connecting the wires 20 to the respective upper end of the long leads 6.

The leads 6 are liable to be vibrated making satisfactory bonding impossible. Accordingly, in this embodiment, the leads 6 which are subjected to wire bonding are interconnected by a reinforcing plate 22 to restrict the vibration of the leads 6 during the ultrasonic bonding process.

The reinforcing plate 22 is formed so as to stabilize the performance of the photoelectric device in operation in a high-frequency band. The reinforcing plate 22 is a partly metallized insulating ceramic plate. That is, nickel films 23 are formed by plating over surface of areas where the reinforcing plate 22 contacts the leads 6, respectively. The leads 6 are fixed firmly to the nickel films 23 by silver solder 24. Accordingly, the leads 6 are restrained from vibration during the ultrasonic bonding process. Furthermore, since the nickel films 23 are formed in a fixed width, area through which electric current flows is increased, so that the parasitic inductance of the leads 6 is reduced to enable stable optical communication in a high-frequency band as high as 565Mbit/sec. For example, the parasitic inductance on the order of 6 nH of a lead of 0.45 mm in diameter and 7 mm in length is reduced to 3 nH by providing gold films 23 of a fixed width over the areas where the reinforcing plate 22 contacts the leads 6.

The fiber guide 4 is attached to the wall of the package body 7 opposite the wall to which the flange 3 is attached. The fiber guide 4 comprises a tubular outer guide member 25 and an inner guide member 26 fitted in the inner portion of the outer guide member 25. The inner portion of the outer guide member 25 penetrates the wall of the package body 7 and the outer guide member 25 is fixed hermetically to the package body 7 by brazing. The outer portion of the outer guide member 25 has a thin wall which can be easily squeezed by caulking. The outer portion of the inner guide member 26 is inserted in the inner portion of the outer guide member 25, the inner portion of the inner guide member 26 is reduced in diameter and the free end of the inner portion of the inner guide member 26 is cut obliquely to form an inclined surface. Prior to passing the free end of the optical fiber cable 5 through the fiber guide 4, the jacket of the optical fiber cable 5 covering the free end of the optical fiber cable 5 is removed to expose the optical fiber 16 along a fixed length so that the exposed optical fiber 16 extends through the entire length of the inner guide member 26 and part of the outer guide member 25, while the jacketed portion of the optical fiber cable 5 extends through the outer portion of the outer guide member 25.

The base plate 9 is fixed to the inner surface of the bottom wall of the package body 7 at a position near the wall to which the flange 3 is attached with a brazing filler material. The Peltier element 10 is fixed to the upper surface of the base plate 9, and hence it is desirable to form the base plate 9 of a material having a high thermal conductivity. The upper and lower electrode plates 27 of the Peltier element 10 are formed of an alumina ceramic having a coefficient of thermal expansion on the order of $6.7 \times 10^{-6}/°$ C. Therefore, if the base plate 9 is formed of copper having a high thermal conductivity and a coefficient of thermal expansion of $17.0 \times 10^{-6}/°$ C., the solder joining the electrode plate 27 to the base plate 9 will be caused to break by fatigue due to the difference between the electrode plate 27 and the base plate 9 in thermal expansion. Accordingly, to avoid the breakage of the solder, the base plate 9 is formed, for example, of a copper/tungsten (Cu/W) alloy having a coefficient of thermal expansion in the range of 6.0 to $7.0 \times 10^{-6}/°$ C. and a thermal conductivity in the range of 0.5 to 0.67 cal/cm•sec•° C. One side of the base plate 9 is in contact with the wall of the package body 7 to transfer heat from the base plate 9 through the wall of the package body 7 to the flange 3. The coefficient of thermal expansion of covar forming the bottom wall of the package body 7 is $5.3 \times 10^{-6}/°$ C. The base plate 9 may be formed of SiC or the like.

Figure 3:
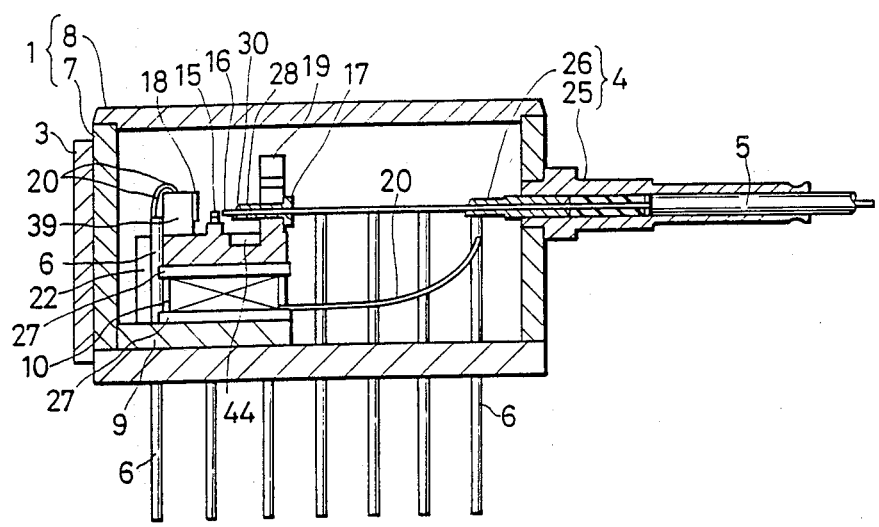
FIG. 3 is a sectional view of the photoelectric device of FIG. 1.
Figure 4:
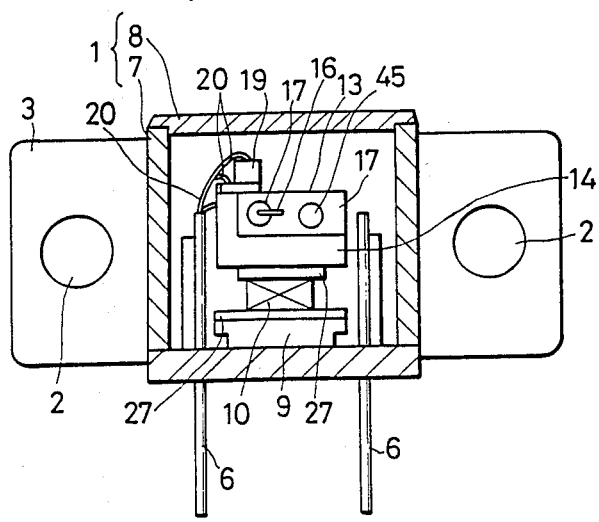
FIG. 4 is a sectional side elevation of the photoelectric device of FIG. 1.
Figure 5:
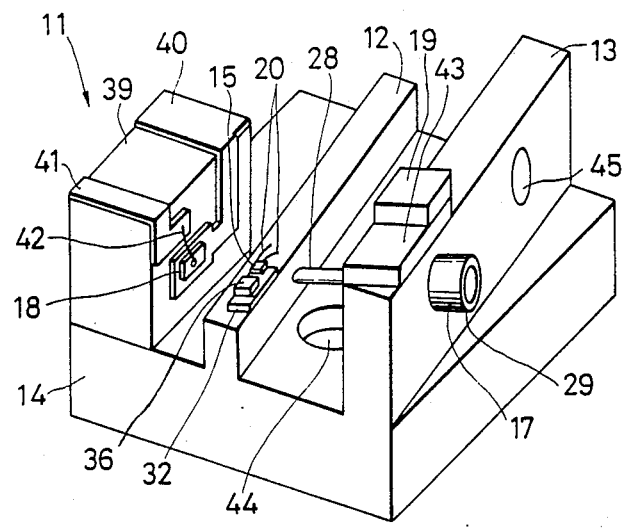
FIG. 5 is a perspective view of the subcarrier of the photoelectric device of FIG. 1.
Figure 6:
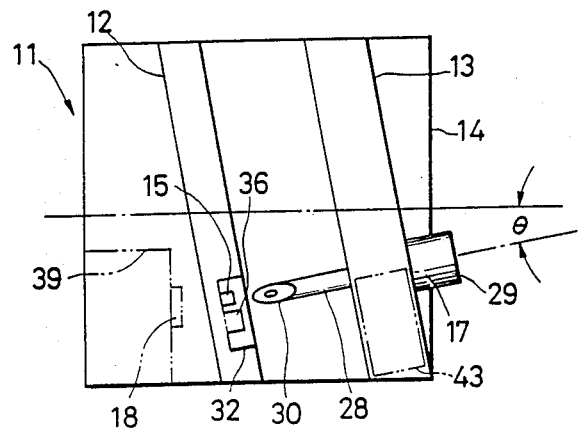
FIG. 6 is a plan view of a heat sink provided on the subcarrier of FIG. 5.
Figure 7:
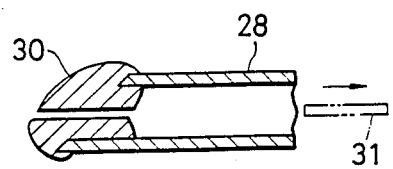
FIG. 7 is a fragmentary sectional view of an optical fiber positioning and fastening member provided on the subcarrier of FIG. 5.

Referring to FIGS. 5 and 6, the heat sink 14 is the principal component of the subcarrier 11. The heat sink 14 is a rectangular plate having the holding part 12 and the supporting part 13 rising from the main surface thereof. The holding part 12 extends across the central portion of the main surface of the heat sink 14 while the supporting part 13 extends in parallel to the holding part 12 on one side of the heat sink 14. The holding part 12 and the supporting part 13 are perpendicular to an inclined axis inclined at an angle $\theta$ to the center axis of the heat sink 14. The tubular positioning and fixing member 17 penetrates and is fixed to the supporting part 13. The positioning and fixing member 17 is an adjustable tube for guiding the optical fiber 16 and for adjusting the position of the free ends of the optical fiber 16. Accordingly, the positioning and fixing member 17 is formed of a material capable of plastic deformation such as, for example, a nickel alloy. As illustrated in FIG. 3, the positioning and fixing member 17 has a deformable, thin, tubular adjusting section 28 passed through the supporting part 13 and a thick, tubular guide section 29 having a shoulder in abutment with the side surface of the supporting part 13. A taper hole is formed in the guide section 29 to facilitate passing the optical fiber 16 through the positioning and fixing member 17. The inside diameter of the positioning and fixing member 17 is slightly greater than the diameter of 125 $\mu$m of the optical fiber 16. The free end of the adjusting section 28 is cut aslant, as will be described hereinafter, to form an inclined surface having an increased area for soldering the optical fiber 16 to the adjusting section 28. A drop of solder 30 not having any flux is attached beforehand to the inclined surface of the adjusting section 28 as shown in FIG. 7. The drop of solder 30 is attached to the inclined surface through steps of passing a dummy wire 31 having a diameter slightly greater than the diameter of 125 $\mu$m of the optical fiber 16 such as, for example, a piano wire of 150 $\mu$m in diameter, through the positioning and fixing member 17, attaching a drop of solder to the free end of the adjusting section 28, drawing out the dummy wire 31, i.e., the piano wire, from the positioning and fixing member 17 as shown in FIG. 7, and removing the flux adhering to the drop of solder 30 through ultrasonic washing.

Figure 8:
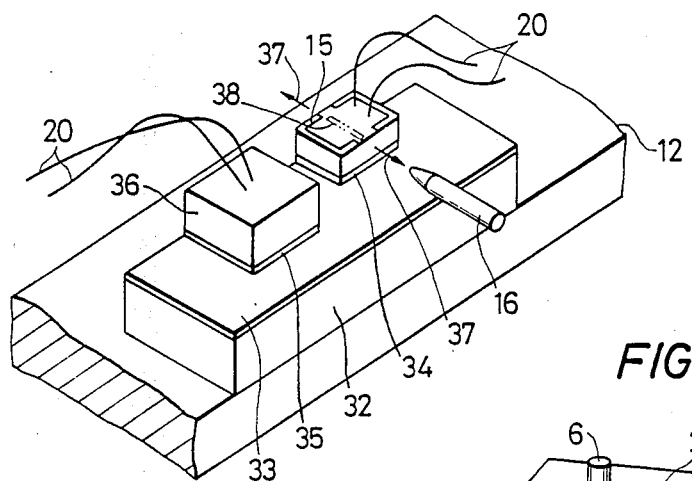
FIG. 8 is a perspective view of assistance in explaining a mode of mounting a laser diode chip on the subcarrier.

A submount 32 is attached fixedly by a fluxless low temperature melting-solder such as, for example, a Pb/Sn/In solder, to the holding part 12 at a position on the prolongation of the adjusting section 28 of the positioning and fixing member 17. The submount 32 is formed of an insulating SiC having a high thermal conductivity and a coefficient $\alpha$ of thermal expansion of $3.7 \times 10^{-6}/°$ C. which is approximate to those of Si and a compound semiconductor. As shown in FIG. 8, the main surface of the submount 32 is metallized to form a metal layer 33. Au/Sn eutectic layers 34 and 35 are formed on the metal layer 33, and the laser diode chip 15 and a gold pedestal 36 are attached fixedly to the upper Au/Sn eutectic layers 34 and 35, respectively. The eutectic layers 34 and 35 may be substituted by a Pb layers or Pb/Sn layers. Thus, the lower electrode of the laser diode chip 15 is connected electrically through the metal layer 33 to the pedestal 36 and as shown in FIG. 8, is fixed to the submount 32 with the resonator 38 which emits a laser light 37 positioned apart from the submount 32, namely, with the P-surface of the pn laser diode chip facing up. The upper electrode of the laser diode chip 15 is connected electrically to the holding part 12 by two wires 20, while the pedestal 36 is connected electrically to the leads 6 by two wires 20 as shown in FIGS. 1 and 2. Such a manner of electrical connection of the laser diode chip 15 and the holding part 12 and that of the pedestal 36 and the leads 6 are necessary to change the polarity to use the driving side of the laser diode chip 15 in driving the same by a fast transistor. The laser diode chip 15 is mounted on the submount 32, and then the submount 32 is fixed to the holding part 12.

In this embodiment, the laser diode chip 15 is biased to one side of the center axis of the heat sink 14 to reduce the necessary length of the wires 20 connecting the pedestal 36 to the leads 6 so that the parasitic inductance is reduced to enable the photoelectric device to be driven stably in a high-frequency band.

Since the laser diode chip 15 and the positioning and fixing member 17 for positioning the optical fiber 16 are dislocated from the center axis of the heat sink 14, the positioning and fixing member 17 is not located on the prolongation of the fiber guide 4 of the package body assembly. Accordingly, when the optical fiber 16 is extended slack between the fiber guide 4 and the positioning and fixing member 17, the optical fiber 16 extends in a curve as shown in FIGS. 2 and 13. When the optical fiber 16 is thus extended slack between the two fixing points, the optical fiber 16 is not exposed to an excessive force even when the distance between the two fixing points varies due to temperature variation, and hence the communication is carried out without any interference. If the optical fiber 16 is extended taut in a straight line between the two fixing points, the relative position of the two fixing points varies due to the thermal expansion or thermal contraction of the associated parts exerting excessive force to or breaking the optical fiber 16. When the optical fiber 16 is extended slack in a curve between the two fixing points, the optical fiber 16 bends in a curve as indicated by an alternate long and short dash line or as indicated by an alternate long and two short dashes line in FIG. 13 when one of the fixing points is shifted relative to the other from a point A where the fixing point is located at a normal temperature to a position B at a high temperature or to a point C at a low temperature, respectively, so that the optical fiber 16 is not exposed to excessive force and hence the optical fiber 16 is not damaged. The inclination $\theta$ of center axis of the positioning and fixing member 17 to the center axis of the heat sink 14 is determined so that the optical fiber 16 extending between the fiber guide 4 and the positioning and fixing member 17 is able to bend moderately and will not be deformed excessively to an extent liable to cause trouble with optical communication. If the inclination $\theta$ is excessively large, the length of the optical fiber 16 between the two fixing positions become excessively large making the assembling work difficult. In this embodiment, the inclination $\theta$ is ten degrees.

A chip carrier 39 mounted with the light receiving element 18 is attached fixedly through an Au/Sn eutectic layer to the main surface of the heat sink 14. The chip carrier 39 is a ceramic block. Metal layers 40 and 41 are formed by metallizing over the main surface, namely, one side surface, and the upper surface of the chip carrier 39, respectively. The light receiving element 18 is attached fixedly through an Au/Sn eutectic layer to the metal layer 40. The upper electrode of the light receiving element 18 is connected electrically to the metal layer 41 by a wire 42. Since the rectangular chip carrier 39 is fixed to the heat sink 14 so that one side thereof conincides with one side of the heat sink 14, the light receiving surface of the light receiving element 18 is inclined to the laser light 37. Accordingly, the laser light is not reflected by the light receiving surface of the light receiving element 18 toward the light emitting surface of the laser diode chip 15, so that the generation of noises attributable to the reflected laser light is obviated.

A thermistor mount 43 mounted with the thermistor 19 for monitoring the temperature of the heat sink 14 is fixed to the upper surface of the supporting part 13 of the heat sink 14. The thermistor mount 43 is a ceramic block metallized over the upper side and backside thereof. The thermistor 19 is attached fixedly through an Au/Sn eutectic layer to the upper surface of the thermistor mount 43 so that the lower electrode of the thermistor 19 is connected electrically to the metallized surface of the thermistor mount 43. As shown in FIGS. 1 and 2, the upper electrode of the thermistor 19 is connected to the corresponding lead 6 by two wires 20, while the metallized surface of the thermistor mount 39 is connected to the corresponding lead 6 by two wires 20.

Figure 14:
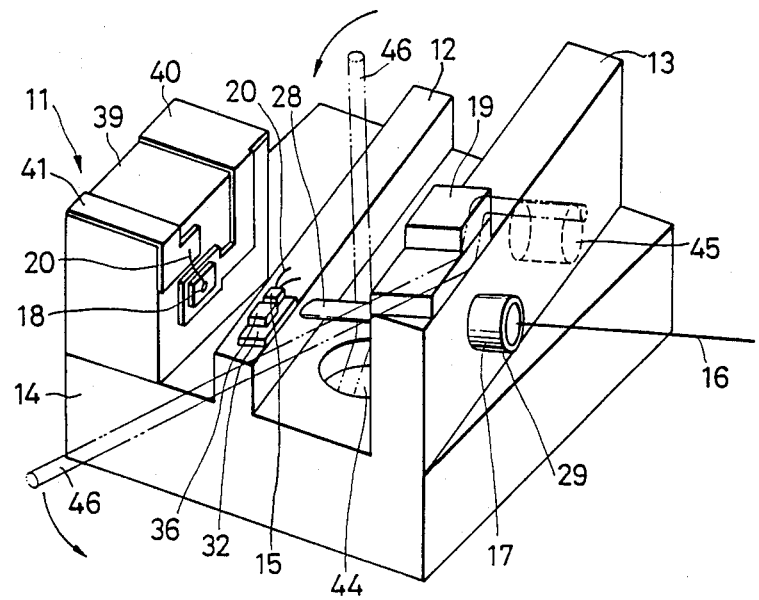
FIG. 14 is a perspective view of assistance in explaining a manner of aligning the optical axes of a laser diode chip and an optical fiber.

Referring to FIG. 5, a recess 44 is formed in the main surface of the heat sink 14 and a hole 45 is formed through the supporting part 13 of the heat sink 14 to facilitate the positional adjustment of the adjusting section 28 of the positioning and fixing member 17. As illustrated in FIG. 14, in adjusting the position of the free end of the adjusting section 28, the one end of a position adjusting bar 46 is placed in the recess 44 or the hole 45 and the position adjusting bar 46 is moved to bend the adjusting section 28 vertically and/or laterally for plastic deformation as indicated by arrows A and B in FIG. 15 to bring the optical axes of the optical fiber 16 and the laser diode chip 15 into alignment. However, the positional adjustment of the adjusting section 28 of the positioning and fixing member 17 for the alignment of the optical axes by means of the position adjusting bar 46 is unable to efficiently achieve the fine alignment of the optical axes requiring an accuracy of 1 $\mu$m or below. The subcarrier 11, namely, a subassembly, of such a construction is assembled through the following steps. First, the thermistor mount 43 mounted with the thermistor 19 is attached fixedly through the Au/Sn eutectic layer to the supporting part 13 of the heat sink 14. Then, the chip carrier 39 mounted with the light receiving element 18 is attached fixedly through the Au/Sn eutectic layer to the heat sink 14, and then the submount 32 mounted with the laser diode chip 15 is fixed to the holding part 12 of the heat sink 14.

Figure 11:
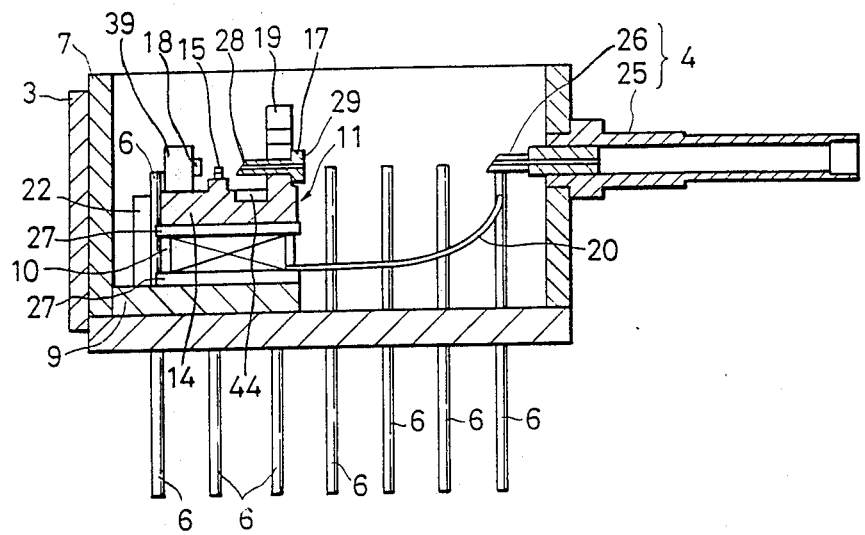
FIG. 11 is a sectional view showing a Peltier element and a subcarrier mounted on the package body of FIG. 9.

Process of assembling the photoelectric device will be described hereinafter. The subassemblies, the Peltier element 10, the optical fiber cable 5 and the lid 8 are prepared individually. Then, as shown in FIG. 11, the Peltier element 10 is soldered by a fluxless solder to the base plate 9 fixed to the bottom wall of the package body 7 of the package body subassembly. Then, the terminals of the Peltier element 10 are connected to the lead 6 by the wires 20. Then, the subcarrier 11 is soldered by a fluxless solder to the upper surface of the Peltier element 10.

Figure 12:
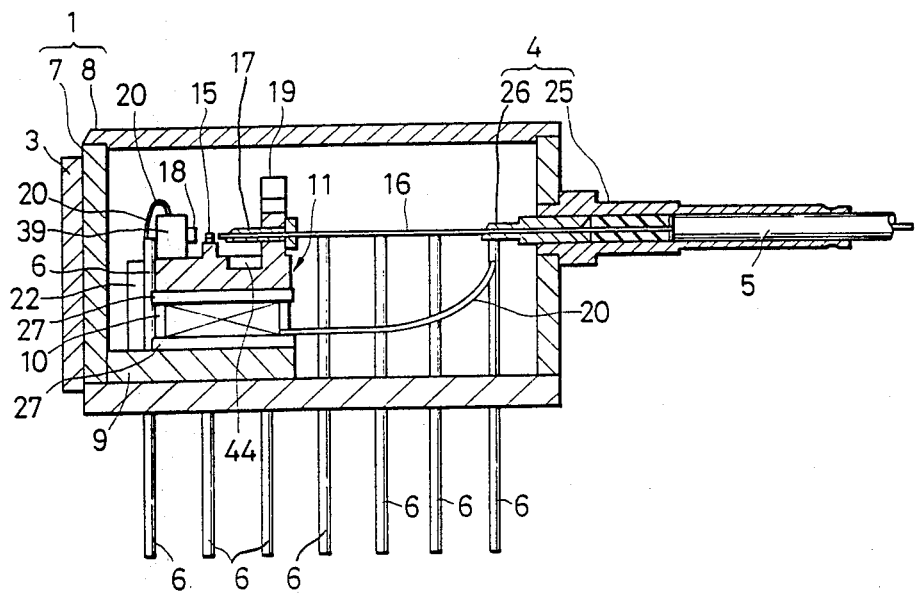
FIG. 12 is a sectional view showing an optical fiber fastened to the subcarrier.

Then, as shown in FIG. 12, the free end of the optical fiber cable 5 is removed of the jacket by a predetermined length from the tip thereof, and then the free end of the optical fiber cable 5 is inserted into the fiber guide 4. The free end of the optical fiber cable 5 passed through the fiber guide 4 is guided manually or by means of a jig into the guide section 29 of the positioning and fixing member 17. Then, the optical fiber cable 5 is held by and is advanced gradually through the guide section 29 by a manipulator or the like until the tip of the optical fiber 16 arrives at a position approximately 20 μm before the light emitting surface of the laser diode chip 15. In this state, the optical fiber 16 extends in a moderate curve owing to the rigidity thereof as shown in FIG. 13. In this state, the outer portion of the fiber guide 4 is caulked to squeeze the jacketed portion of the optical fiber cable 4 to fix the optical fiber cable 5 temporarily. Then, the drop of solder 30 is fused to fix the optical fiber 16 to the inner end of the adjusting section 28 of the positioning and fixing member 17. Then, the optical fiber 16 is soldered by a fluxless solder to the inner end of the fiber guide 4. The fluxless solder may be provided beforehand on the inner end of the fiber guide 4 as the drop of solder 30 provided before hand on the free end of the adjusting section 28 of the subcarrier 11.

Then, the respective electrodes of the laser diode chip 15, the light receiving element 18 and the thermistor 19 are connected electrically to the corresponding leads 6 by the wires 20 by ultrasonic bonding. Since the leads 6 are reinforced by the reinforcing plates 22, the leads 6 will not vibrate during ultrasonic bonding, so that the ultrasonic bonding process is achieved satisfactorily.

Then, the laser diode chip 15 is driven to emit the laser light 37. The intensity of the laser light 37 received by the optical fiber 16 through one end of the same facing the laser diode chip 15 is detected at the other end of the optical fiber 16 to bring the respective optical axes of the laser diode chip 15 and the optical fiber 16 into alignment. In aligning the optical axes, the adjusting section 28 of the positioning and fixing member 17 is bent plastically in a two-dimensional space. Since the adjusting section 28 of the positioning and fixing member 17 is deformed plastically, the adjusting section 28 maintains the shape as adjusted for aligning the optical axes. Then, the lid 8 is attached hermetically by brazing to the package body 7 so as to close the upper opening of the same to complete the photoelectric device as shown in FIG. 3.

In assembling the photoelectric device according to the present invention for optical communication, the box-shaped package body having the leads of the dual in line type, the Peltier element, the optical fiber cable and the subcarrier are prepared individually. The subcarrier comprises, as the principal component thereof, the heat sink having the holding part and the supporting part, the submount mounted with the laser diode chip and attached fixedly to the holding part, and the plastically deformable tubular positioning and fixing member for positioning and fixing the optical fiber, provided with a drop of solder at the inner end thereof and penetrating through the supporting part of the heat sink. The chip carrier mounted with the light receiving element for monitoring the laser light is fixed to the main surface of the heat sink, and the thermistor for detecting the temperature of the heat sink is fixed to the supporting part of the heat sink. The laser diode chip is biased from the center axis of the heat sink. The positioning and fixing member is extended with the center axis inclined at an angle to the center axis of the heat sink. The recess and the through hole for use in plastically deforming the positioning and fixing member are formed in the heat sink.

In assembling the photoelectric device, the Peltier element is fixed to the bottom wall of the package body, then the subcarrier is fixed to the upper surface of the Peltier element. Then, the optical fiber is inserted through the fiber guide attached to the package body and through the positioning and fixing member of the subcarrier, inclined to the center axis of the fiber guide to locate the free end of the optical fiber opposite to the light emitting surface of the laser diode chip. The chip carrier mounted with the light receiving element for monitoring the laser light is fixed to the main surface of the heat sink, while the thermistor is fixed to the supporting part of the heat sink. The laser diode chip is dislocated from the center axis of the heat sink, and the positioning and fixing member is extended with the center axis thereof inclined to the center axis of the heat sink. The recess and the through hole for use in plastically deforming the positioning and fixing member are formed in the heat sink.

In assembling the photoelectric device, first the Peltier element is fixed to the bottom wall of the package body, then the subcarrier is fixed to the upper surface of the Peltier element. The free end of the optical fiber is inserted through the fiber guide of the package body and through the positioning and fixing member of the subcarrier disposed with the center axis thereof inclined to the center axis of the fiber guide so that the tip thereof is positioned opposite to the light emitting surface of the laser diode chip. Then, the outer guide member of the fiber guide is caulked to squeeze the jacketed portion of the optical fiber cable to hold the optical fiber cable firmly, and the optical fiber is soldered to the inner end of the fiber guide and to the inner end of the positioning and fixing member. The optical fiber is extended slack in a curve between the positioning and fixing member and the fiber guide. Then, the electrodes of the elements are connected electrically to the inner ends of the corresponding leads by the conductive wires, respectively. Then, the laser diode chip is driven to make the laser diode chip emit the laser light, and one end of the position adjusting bar is placed in the recess or hole formed in the subcarrier to deform the positioning and fixing member holding the optical fiber plastically in a plane perpendicular to the axis of the optical fiber monitoring the intensity of the laser light to bring the optical axis of the optical fiber into alignment with the optical axis of the laser diode chip. Then, the lid is attached hermetically to the package body to complete the photoelectric device.

Thus, in assembling the photoelectric device, the subcarrier is constructed by assembling the laser diode chip, the light receiving element and the thermistor at a high accuracy in an integral unit, and only the position of the free end of the optical fiber fixed to the positioning and fixing member of the subcarrier requires accurate adjustment. Accordingly, the photoelectric device can be manufactured at a high productivity. Furthermore, since the positioning and fixing member holding the optical fiber is capable of plastic deformation and is deformed plastically within a plane perpendicular to the axis of the optical fiber to bring the axis of the optical fiber into alignment with the optical axis of the laser diode chip, the positioning and fixing member maintains the shape as plastically deformed, so that the highly efficient optical connection of the laser diode chip and the optical fiber is maintained for the high reliability of the photoelectric device. Still further, since the positioning and fixing member is extended with the center axis thereof inclined to the center axis of the fiber guide, the optical fiber extends in a curve between the positioning and fixing member and the fiber guide, so that only the curvature of the optical fiber varies when the distance between the two fixing point on the positioning and fixing member and on the fiber guide is changed due to the difference between the components in coefficient of thermal expansion, and hence the optical fiber is not subjected to an excessive stress and thereby the efficiency of the optical connection of the laser diode chip and the optical fiber is maintained at a high level. Moreover, since the laser diode chip is biased to one side of the center axis of the photoelectric device, the laser diode chip is connected to the leads by the short wires and hence the parasitic inductance is reduced, so that the photoelectric device is capable of operating satisfactorily in a high-frequency band. Since any resin containing a flux is not used in bonding the components of the photoelectric device, the components of the photoelectric device is not degraded by detrimental substances, so that the reliability of the photoelectric device is stabilized.

That is, in the photoelectric device of the present invention, the optical fiber having a free end located opposite to the light emitting surface of the laser diode chip is held by the tubular positioning and fixing member capable of plastic deformation, and the positioning and fixing member is deformed plastically in a plane perpendicular to the axis thereof, namely, the optical axis of the optical fiber, in all directions to bring the optical axis of the optical fiber into alignment with that of the laser diode chip. Thus, the position of the free end of the optical fiber can be adjusted two-dimensionally by plastically deforming the positioning and fixing member holding the optical fiber in a plane perpendicular to the optical axis of the optical fiber to bring the optical axis of the optical fiber into alignment with the optical axis of the laser diode chip at a high accuracy. Since the positioning and fixing member is formed of a material capable of plastic deformation, the adjustment of the positioning and fixing member for aligning the optical axes can be easily achieved without requiring any particular equipment and any particular skill. Furthermore, since the positioning and fixing member is deformed plastically for aligning the optical axes of the laser diode chip and the optical fiber, the elastic variation of the shape of the positioning and fixing member will not occur after the adjustment, and hence the efficiency of the optical connection of the laser diode chip and the optical fiber remains as adjusted to maintain the high reliability of the photoelectric device.

Figure 15:
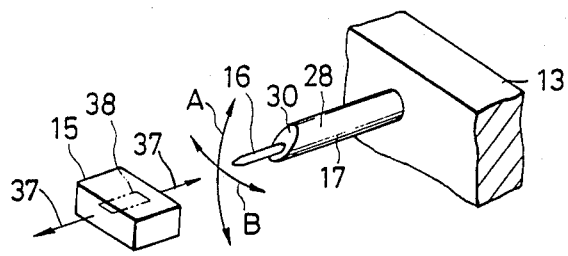
FIG. 15 is a perspective view of assistance in explaining directions of movement of the optical fiber positioning and fastening member.

The manner of aligning the optical axis of the optical fiber with that of the laser diode chip will be described in detail with reference to FIG. 15. The optical fiber 16 of the optical system is held firmly by the tubular positioning and fixing member 17 capable of plastic deformation. The positioning and fixing member 17 is deformed plastically to bring the optical axis of the optical fiber 16 into alignment with the optical axis of the laser diode chip 15 to enable the optical fiber 16 to receive the laser light 37 emitted from the laser diode chip 15 efficiently. As the positioning and fixing member 17 is deformed, the free end of the optical fiber 16 is moved in a plane perpendicular to the optical axis of the laser diode chip 15 in directions represented by the arrows A and B. Since the direction of light reception of the optical fiber 16 which is substantially the same as the direction of extension of the optical fiber 16 is movable in a plane perpendicular to the direction of travel of the laser light 37 emitted from the laser diode chip 15, the direction of light reception of the optical fiber 16 can be brought into coincidence with the direction of travel of the laser light 37. This optical axis adjusting work may preferably be carried out in the following manner.

First, the laser diode chip 15 is secured in place and the optical fiber 16 is fixed to the positioning and fixing member 17 after passing the optical fiber 16 through the tubular positioning and fixing member 17 so that the free end of the optical fiber 16 is projected from the positioning and fixing member 17. Prior to fixing the optical fiber 16 to the positioning and fixing member 17, the position of the optical fiber 16 is adjusted roughly so that the optical axis of the optical fiber 16 is approximately in alignment with the optical axis of the laser diode 15 along which the laser light 37 travels. Then, the laser diode chip 15 is driven to emit the laser light 37 and the positioning and fixing member 17 is deformed plastically to position the free end of the optical fiber 16 so that the intensity of the laser light received by the optical fiber 16 becomes the highest while the intensity of the laser light received by the optical fiber 16 is being monitored. Thus, the direction of laser light reception of the optical fiber 16 is brought into coincidence with the direction of travel of the laser light 37 emitted from the laser diode chip 15. The positioning and fixing member 17 is deformed plastically by means of a tool, which will be described hereinafter. Accurate alignment of the direction of laser light reception of the optical fiber 16 with the optical axis of the laser diode chip 15 is particularly important when the optical fiber 16 is a single-mode optical fiber for long-distance communication. Since the accurate alignment of the direction of laser light reception of the optical fiber 16 with the optical axis of the laser diode chip 15 enhances the intensity of the laser light transmitted through the optical fiber 16, reduction in the possible distance of communication attributable to the attenuation of the laser light within the optical fiber 16 is obviated.

It is one of the features of the present invention to extend the tubular positioning and fixing member 17 capable of plastic deformation through and to fix the same to the supporting part 13. The positioning and fixing member 17 serves as means for holding and positioning the optical fiber 16. Accordingly, the positioning and fixing member 17 is formed of a material capable of easy plastic deformation such as, for example, a cupronickel, and has the deformable adjusting section 28 having a smaller diameter and penetrating the supporting part 13, and a guide section 29 having a larger diameter and having the shoulder in abutment with the outer side of the supporting part 13. The free end of the optical fiber 16 is passed through the positioning and fixing member 17 and is fixed to the extremity cut aslant of the adjusting section 28 by the solder 30. The extremity of the free end of the optical fiber 16 held fixedly by the adjusting section 28 is located opposite to one of the light emitting surfaces of the laser diode chip 15. Since the adjusting section 28 of the positioning and fixing member 17 is formed of a material capable of plastic deformation in an elongate shape, the adjusting section 28 can be easily and correctly bent for the positional adjustment of the extremity of the adjusting section 28 when a force is applied in parallel to a plane perpendicular to the axis of the adjusting section 28 by means of the position adjusting bar 46 or a suitable tool. Consequently, as shown in FIG. 15, the positional adjustment of the extremity of the optical fiber 16 held by the adjusting section 28 is achieved to bring the optical axis of the optical fiber 16 into highly accurate alignment with that of the laser diode chip 15.

Since the adjusting section 28 is bent plastically, the adjusting section 28 remains as bent after the alignment of the optical axes of the optical fiber 16 and the laser diode chip 15, so that the efficiency of optical connection as adjusted is maintained.

The photoelectric device in the first embodiment thus constructed provides the following effects:

(1) The optical fiber 16 is held fixedly at two fixing points so as to extend in a curve with the extremity thereof disposed opposite to the light emitting surface of the laser diode chip, and hence only the form of the curve along which the optical fiber extends between the two fixing points varies according to the variation of the distance between the two fixing points attributable to temperature variation. Therefore, the optical fiber is not exposed to any excessive stress and thereby the buckling or breakage of the optical fiber is obviated.

(2) Since the optical fiber is not exposed to any excessive stress as mentioned in paragraph (1), above the solder fixing the optical fiber will not be caused to fracture due to fatigue, so that the high efficiency of optical connection of the laser diode chip and the optical fiber as adjusted is maintained.

(3) Owing to the effects mentioned in paragraphs (1) and (2), the photoelectric device is capable of stable optical communication.

(4) Since the photoelectric device is completed by assembling subassemblies assembled at a high accuracy, the photoelectric device can be easily and accurately assembled.

(5) The subcarrier is formed by incorporating the laser diode chip, the light receiving element, the thermistor, and the positioning and fixing member for positioning and fixedly holding the optical fiber into the heat sink, as mentioned in article (4). Accordingly, the assembly of the essential components of the photoelectric device is achieved by fixing the subcarrier to the Peltier element fixed to the package body subassembly, and aligning the optical axis of the optical fiber fixedly held by the positioning and fixing member of the subcarrier with that of the laser diode chip, which enables accurate assembly of the photoelectric device.

(6) The photoelectric device is completed by assembling the two assemblies and a few pieces of individual parts as mentioned in paragraph (4), so that the photoelectric device improves the productivity of the production line.

(7) Highly accurate alignment of the respective optical axes of the laser diode chip and the optical fiber is achieved by bending the free end of the positioning and fixing member for positional adjustment, which provides the photoelectric device with a high quality.

(8) Highly accurate alignment of the respective optical axes of the laser diode chip and the optical fiber is achieved by plastically deforming the positioning and fixing member and hence the positioning and fixing member maintains the shape as adjusted, which provides the photoelectric device with stable reliability.

(9) Since neither any resin nor any flux is used in assembling the package, the degradation of the components attributable to resins and fluxes will not occur, which enhances the reliability of the photoelectric device.

(10) The laser diode chip is biased relative to the center axis of the package and the laser diode chip is connected electrically to the leads by short wires, and thereby the performance of the photoelectric device in the high-frequency band is stabilized.

(11) The recess formed in the subcarrier to pivotally support the position adjusting bar in plastically deforming the positioning and fixing member fixedly holding the optical fiber with the position adjusting bar facilitates the plastic deformation of the positioning and fixing member.

(12) Owing to the effects mentioned in paragraphs (1) to (11), the highly accurate optical connection of the laser diode chip and the optical fiber can be easily achieved and the photoelectric device capable of maintaining the highly accurate optical connection can be manufactured at a low cost.

(13) The optical fiber is held by the tubular positioning and fixing member capable of plastic deformation with the extremity thereof disposed opposite to the light emitting surface of the laser diode chip, and the positioning and fixing member can be bent in optional directions within a plane perpendicular to the direction of extension of the optical fiber, so that the alignment of the respective optical axes of the laser diode chip and the optical fiber can be achieved at a high accuracy.

(14) As mentioned in paragraph (13), the positioning and fixing member holding the optical fiber is formed of a material capable of plastic deformation and hence the positioning and fixing member maintains the shape as adjusted unless an external force is applied thereto, so that the optical connection of the laser diode chip and the optical fiber as adjusted is maintained for a longtime improving the reliability of the photoelectric device.

(15) Forming the positioning and fixing member holding the optical fiber of a material capable of plastic deformation as mentioned in paragraph (13) facilitates the positional adjustment of the optical fiber.

(16) Forming the positioning and fixing member holding the optical fiber of a material capable of plastic deformation as mentioned in paragraph (13) enables each positional adjustment of the positioning and fixing member requiring neither any special equipment nor highly skilled hand.

(17) The leads to which wires are connected through ultrasonic bonding are reinforced with reinforcing plates, so that the wires are connected securely to the leads improving the reliability of ultrasonic bonding in assembling the photoelectric device.

(18) Conductive gold films are formed on the reinforcing plates in areas where the reinforcing plates contact the leads, respectively, and hence the parasitic inductance of the leads is reduced substantially, so that the performance of the photoelectric device in the high-frequency band is stabilized.

Although the first embodiment of the present invention has been described concretely, the present invention is not limited thereto in application and many changes and variations are possible in the invention without departing from the scope thereof. For example, when the fiber guide 4 and the positioning and fixing member 17 are disposed coaxially, the optical fiber 16 may be extended in a spiral form between the inner end of the fiber guide 4 and the outer end of the positioning and fixing member 17 to enable the flexible deformation of the optical fiber 16.

Figure 16:
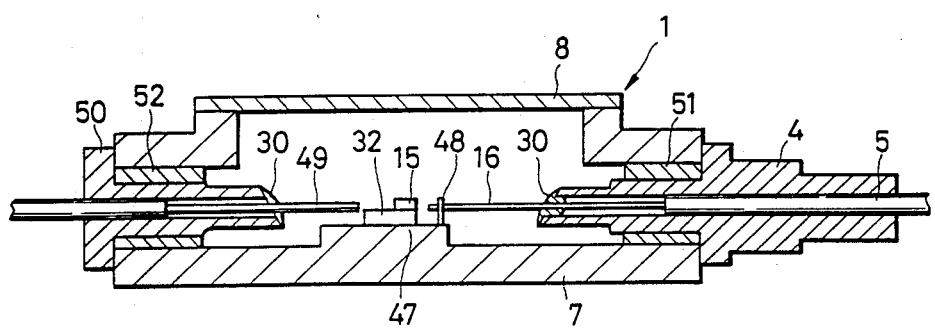
FIG. 16 is a sectional view showing the essential portion of a photoelectric device, in a second embodiment, according to the present invention.

In a photoelectric device, in a second embodiment, according to the present invention shown in FIG. 16, an optical fiber 16 projecting from the inner end of a fiber guide 4 into the interior of a package 1 is held fixedly by a position adjusting pin 48 fixed to a base 47 of a package body 7 (stem). The optical fiber 16 many be extended between the fiber guide 4 and the position adjusting pin 48, namely, two fixing points, in a curve as shown in FIG. 13 or in a spiral form so that the optical fiber 16 is able to change the form of extension even when the distance between the two fixing points varies due to temperature variation. Accordingly, even in a configuration shown in FIG. 16, the optical fiber 16 is not exposed to repeated stress and hence stable optical transmission is possible.

The photoelectric device shown in FIG. 16 will be described briefly. This photoelectric device has a flat metallic package body (stem) 7 and a submount 32 fixedly mounted with a laser diode chip 15 is fixed to a pedestal 47 provided in the central portion of the package body 7. An optical fiber cable 5 is passed through a fiber guide 4 penetrating one of the side walls of the package body 7. An optical fiber 16 exposed by removing the jacket covering the free end of the optical fiber cable 5 is passed through and held fixedly by a position adjusting pin 48 disposed before the laser diode chip 15 with the extremity thereof disposed opposite to one of the light emitting surfaces of the laser diode chip 15. The extremity of a monitoring optical fiber 49 for monitoring the intensity of the laser light emitted from the laser diode chip 15 is disposed opposite to the other light emitting surface of the laser diode chip 15. The monitoring optical fiber 49 is passed through a tubular monitoring fiber guide 50 penetrating a side wall of the package body 7 opposite the side wall of the same penetrated by the fiber guide 4. Both the fiber guide 4 and the monitoring fiber guide 50 are fixed to the package body 7 by brazing filler metals 51 and 52, while the optical fiber 16 and the monitoring optical fiber 49 are fixed to the fiber guide 4 and the monitoring fiber guide 50, respectively by solder 30.

Although the present invention has been described with reference to the first and second embodiments thereof as applied to photoelectric devices for optical communication, the present invention is not limited thereto in its application; the present invention is applicable to fixing an optical fiber at least at two adjacent points.

Figure 17:
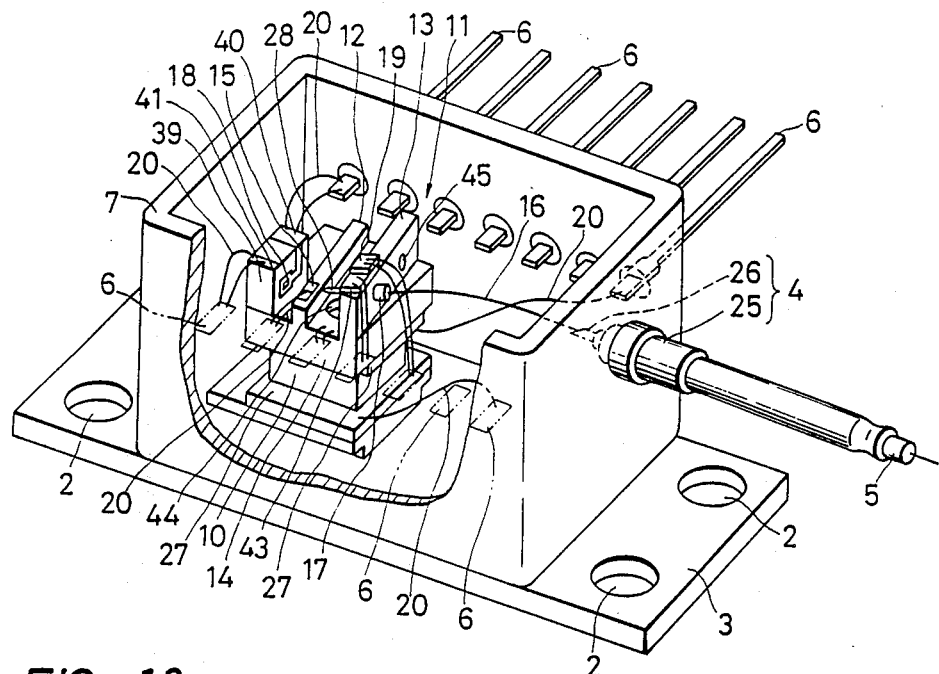
FIG. 17 is a perspective view showing the essential portion of a photoelectric device, in a third embodiment, according to the present invention.

A photoelectric device, in a third embodiment, according to the present invention will be described briefly hereinafter with reference to FIG. 17. This photoelectric device has a package body 7, a flange 3 attached to the bottom wall of the package body 7, and leads 6 projecting from the opposite side walls of the package body 7. The effects of the third embodiment thus constructed are the same as those of the foregoing embodiments.

Figure 18:
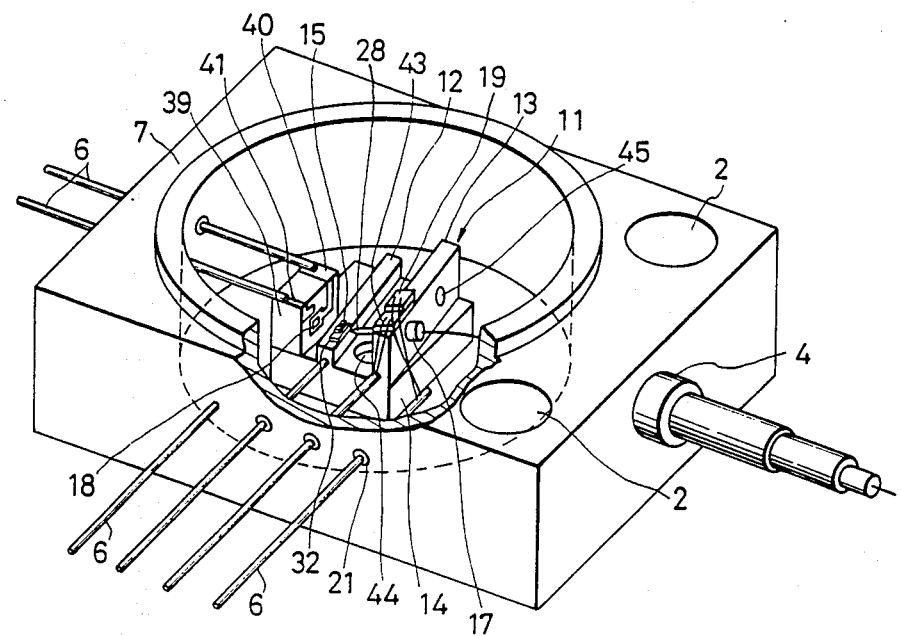
FIG. 18 is a perspective view showing the essential portion of a photoelectric device, in a fourth embodiment, according to the present invention.

A photoelectric device, in a fourth embodiment, according to the present invention will be described with reference to FIG. 18. This photoelectric device has a construction of a flat package type and is not provided with any Peltier element, however, the effects thereof are the same as those of the foregoing embodiments.

This photoelectric device has a package 1 comprising a box-shaped metallic package body 7 (stem) containing the components in a central recess formed in the main surface thereof, and a lid 8 covering the recess of the package body 7. An optical fiber cable 5 is passed through one of the wall of the package body 7 into the recess. A set of two leads 6 and two sets of pairs of leads 6 penetrate the adjacent side walls of the package body 7, respectively. Through holes 2 for receiving fastening members therethrough are formed in the adjacent corners of the package body 7. A subcarrier 11, which is identical with the subcarrier of the first embodiment, is placed fixedly in the central recess of the package body 7. The optical fiber cable 5 is passed through a fiber guide 4 penetrating one side wall of the package body 7 and the free end of the exposed optical fiber 16 of the optical fiber cable 5 is held fixedly by the positioning and fixing member 17 of the subcarrier 11 with the extremity thereof disposed opposite to the light emitting surface of a laser diode chip 15 mounted on the holding part 12 of the subcarrier 11. The respective electrodes of the laser diode chip 15, a light receiving element 18 and a thermistor 19 attached to the subcarrier 11 are connected to the inner ends of the corresponding leads 6 by pairs of wires 20, respectively. This embodiment need not necessarily be provided with a Peltier element. A Peltier element may be attached to the backside of the package body 7 and the Peltier element may be controlled on the basis of the temperature detected by the thermistor 19 to regulate the temperature of the package body 7 in a desired temperature range for stable optical communication.

Figure 19:
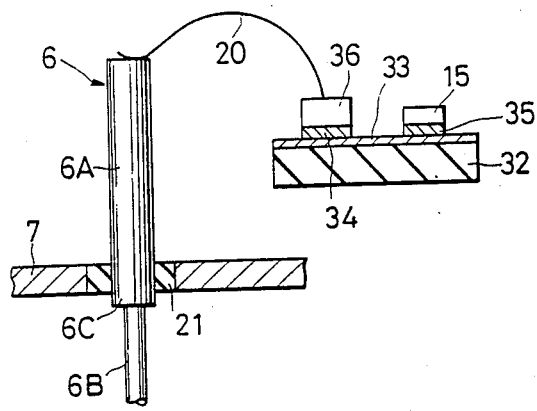
FIG. 19 is a schematic illustration of assistance in explaining a manner of fastening the leads of a photoelectric device, in a fifth embodiment, according to the present invention.
Figure 20:
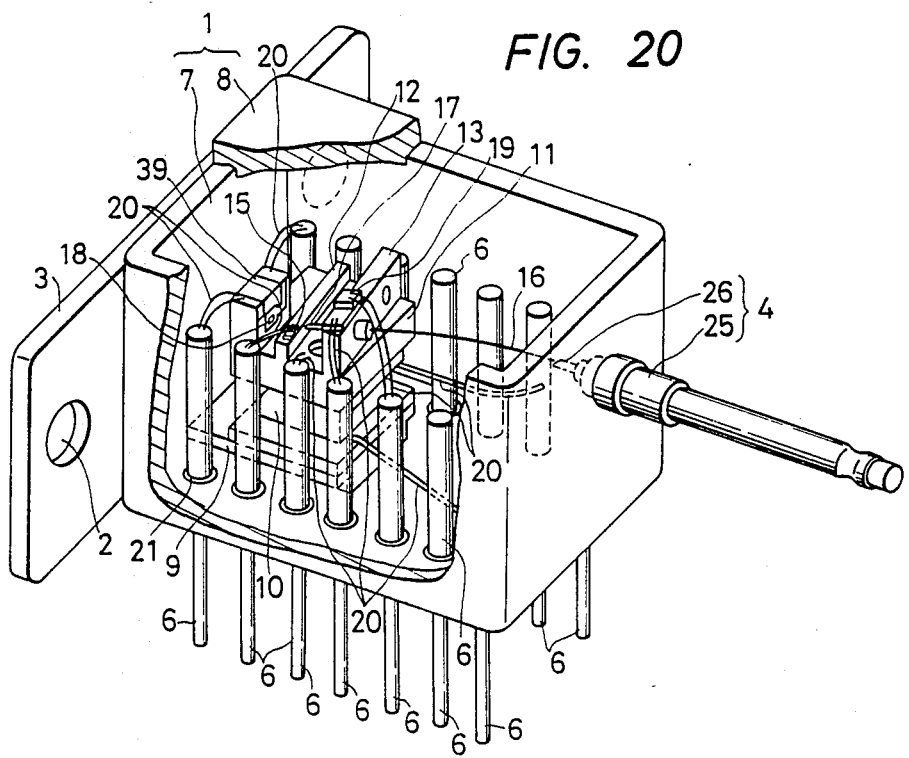
FIG. 20 is a perspective view showing the essential portion of the photoelectric device of FIG. 19.

A photoelectric device for optical communication, in a fifth embodiment, according to the present invention will be described hereinafter with reference to FIGS. 19 and 20.

A package body assembly comprises a package body 7 as the principal component, a flange 3 having through holes 2 for receiving fastening members therethrough and attached to one side wall of the package body 7, a fiber guide 4 penetrating one side wall of the package body 7, fourteen leads 6 penetrating the bottom wall of the package body 7, and a base plate 9 attached to the inner surface of the bottom wall of the package body 7.

The leads 6 are arranged in two rows each having the seven leads 6. Each lead 6 penetrates the bottom wall of the package body 7 and is insulated from and fixed to the bottom wall of the package body 7 by an insulating fixing member 21 formed of covar glass having a coefficient of thermal expansion substantially the same as that of covar forming the bottom wall of the package body 7.

The construction of the leads 6 is one of the features of the present invention. Each lead 6 has a thick section 6A extending inside the package body 7 and having a diameter of 0.75 mm, and a thin section 6B projecting from the package 1 and having a diameter of 0.45 mm. The lead 6 is formed by welding the thick section 6A to the head 6C having a diameter of 0.75 mm of the thin section 6B. Wires 20 connected to a Peltier element 20 is connected to the lead 6 by welding, while the rest of the wires 20 are connected to the leads 6 by ultrasonic bonding. In the ultrasonic bonding process, the wires are bonded to the leads 6 by the agency of ultrasonic vibrations. Since the wires 20 are bonded to the respective upper ends of the thick sections 6A of the leads 6, the leads 6 will not be vibrated during the ultrasonic bonding process enabling reliable wire bonding. Even though the diameter of the leads 6 is increased partially, the parasitic inductance of the leads 6 is reduced enabling the photoelectric device to function satisfactorily for optical communication in a high-frequency band as high as 565 megabits or higher.

This photoelectric device has the following effects.

(1) Since the leads each has a thin section extending outside the package and having a diameter conforming to the prevailing standard, and a thick section extending inside the package, the parasitic inductance of the lead is small and hence the photoelectric device has stable high-frequency characteristics.

(2) Since the laser diode chip is biased toward the leads to which the same is connected electrically, the electrodes of the laser diode chip can be connected to the leads by short wires having a smaller parasitic inductance, so that the photoelectric device has stable high-frequency characteristics.

(3) Owing to the effects mentioned in articles (1) and (2), the photoelectric device has stable high-frequency characteristics.

(4) Since the wires are bonded to the thick sections of the leads by ultrasonic bonding as mentioned in article (1), the leads are not caused to vibrate during the ultrasonic bonding process enabling reliable wire bonding.

(5) Each lead having a thick section and a thin section can be manufactured at a low manufacturing cost simply by welding together a thick lead and a thin lead.

The leads need not necessarily be made through welding, but may be made through machining.

Figure 21:
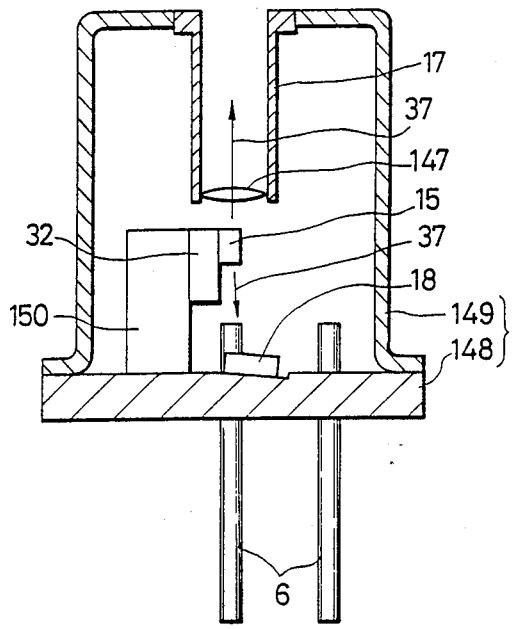
FIG. 21 is a sectional view showing the essential portion of a photoelectric device, in a sixth embodiment, according to the present invention.

A photoelectric device, in a sixth embodiment, according to the present invention will be described hereinafter with reference to FIG. 21.

This photoelectric device employs an optical system for receiving laser light 37 emitted from a laser diode chip 15, including a lens 147 fixedly provided inside a tubular positioning and fixing member 17. The effects of sixth embodiment are the same as those of the first embodiment. The positioning and fixing member 17, similarly to the positioning and fixing member 17 of the first embodiment, is formed of a material capable of plastic deformation. A package 1 comprises a stem 148 formed of a flat plate, and a bell-shaped cap 149 covering the main surface of the stem 148. Three leads 6 are fixed to the stem 148. One of the leads 6 is fixed directly to the stem 148, while the rest of the leads 6 penetrate, are fixed to and are insulated from the stem 148. A heat block 150 is fixed to the main surface of the stem 148. A submount 32 fixedly mounted with the laser diode chip 15 is attached fixedly to the side surface of the heat block 150. A light receiving element 18 for monitoring the laser light 37 emitted from the laser diode chip 15 is fixed to the main surface of the stem 148. The positioning and fixing member 17 hermetically containing the lens 147 at the lower end thereof is fixed to the upper wall of the cap 149. The laser light 37 emitted from the laser diode chip 15 disposed below the positioning and fixing member 17 is received through the lens 147. The positioning and fixing member 17 can be easily bent along a plane perpendicular to the direction of travel of the laser light 37 transmitted through the lens 147. That is, since the positioning and fixing member 17 is formed of a material capable of plastic deformation in an elongate shape, the respective optical axes of the laser diode chip 15 and the optical system can be easily and accurately aligned.

A photoelectric device, in a seventh embodiment, according to the present invention will be described hereinafter with reference to FIGS. 22 and 23.

This photoelectric device is featured by the component parts employed therein which can be efficiently heated in a short time for local heat processing and by the construction allowing assembling without degrading the efficiency of the optical connection of the components as adjusted prior to assembling.

In this embodiment, a positioning and fixing pin 116 for positioning and holding an optical fiber 114, and a fiber guide 112 for holding the optical fiber 114 are secured to a stem 102 through heat insulating members 121 and 113 formed of covar glass having a low thermal conductivity, respectively. The optical fiber 114 is fixed to the positioning and fixing pin 116 and to the fiber guide 112 by soldering. In soldering the optical fiber 114 to the positioning and fixing pin 116 and to the fiber guide 112, the positioning and fixing pin 116 and the fiber guide 112 are heated locally. Since the positioning and fixing pin 116 and the fiber guide 112 are heat-insulated from the stem 102, heat applied to the positioning and fixing pin 116 and the fiber guide 112 will not readily be transferred from the positioning and fixing pin 116 and the fiber guide 112 to the stem 102 having a large heat capacity. Accordingly, the positioning and fixing pin 116 and the fiber guide 112 are heated properly facilitating soldering the optical fiber 114 to the positioning and fixing pin 116 and to the fiber guide 112. Since heat is transferred scarcely from the positioning and fixing pin 116 and the fiber guide 112 to the stem 102 when the positioning and fixing pin 116 and the fiber guide 112 are heated locally for soldering, the stem 102 is not caused to expand by the heat applied to the positioning and fixing pin 116 and the fiber guide 112, so that the relative position between a laser diode chip 109 mounted on a submount 108 and secured to a pedestal 107 formed on the stem 102, and the positioning and fixing pin 116 remains as adjusted prior to soldering the optical fiber 114 to the positioning and fixing pin 116 and to the fiber guide 112, and hence the highly efficient optical connection of the laser diode chip 109 and the optical fiber 114 as adjusted is maintained for highly accurate assembling.

Figure 23:
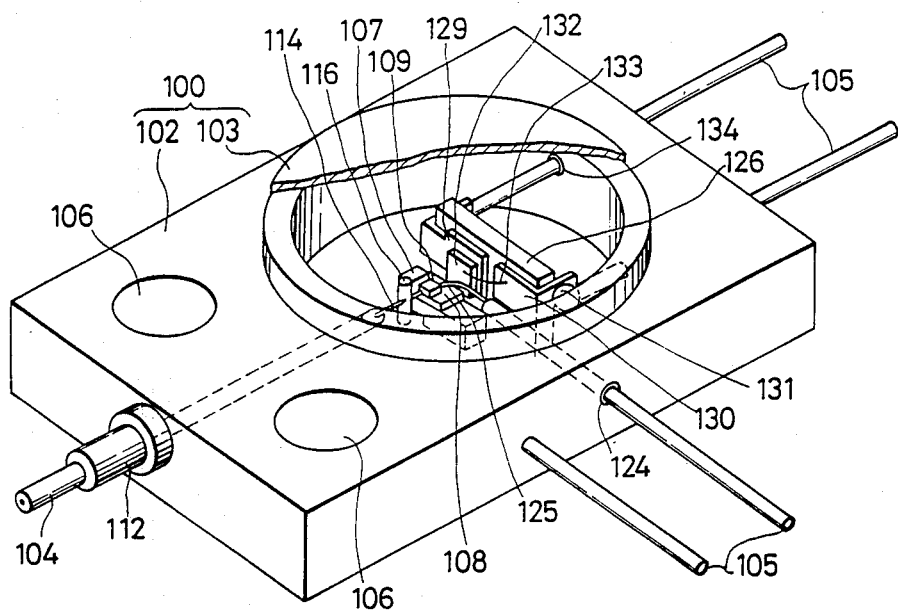
FIG. 23 is a general perspective view of the semiconductor laser device of FIG. 22.

Referring to FIG. 23, the photoelectric device is formed in a flat module. A package 100 comprises the box-shaped stem 102 having a recess formed in the main surface thereof and containing the components of the photoelectric device, and a metallic lid 103 covering the recess of the stem 102. The stem 102 and the lid 103 are formed, for example, of covar, namely, an alloy of iron, nickel and cobalt (Fe/Ni/Co). An optical fiber cable 104 and two pairs of leads 105 are connected to the package 100. At least two through holes 106 are formed at the corners of the stem 102, respectively, to receive fastening members therethrough.

The submount 108 fixedly holding the laser diode chip 109 (semiconductor laser element) is secured to the rectangular pedestal 107 formed at the center of the recess of the stem 102. As shown in FIG. 22, the submount 108 is fixed to the pedestal 107 of the stem 102 by a bonding material 110, while the laser diode chip 109 is fixed to the submount 108 by a bonding material 111. The tubular fiber guide 112 penetrates one of the side walls of the stem 102 and is secured hermetically to the stem 102 by the heat insulating member 113 formed of a heat insulating material such as, for example, covar glass having a thermal conductivity on the order of 0.04 cal/cm•sec•° C. The fiber guide 112 receives the free end of the optical fiber cable 104 therethrough. A portion of the jacket covering the free end of the optical fiber cable 104 is removed to expose the optical fiber 114 consisting of a core and a cladding. The outer end of the fiber guide 112 is caulked to hold the optical fiber cable 104 securely. The circumference of the optical fiber 114 is metallized to enable soldering the optical fiber 114 to the fiber guide 112 by solder 115.

Figure 22:
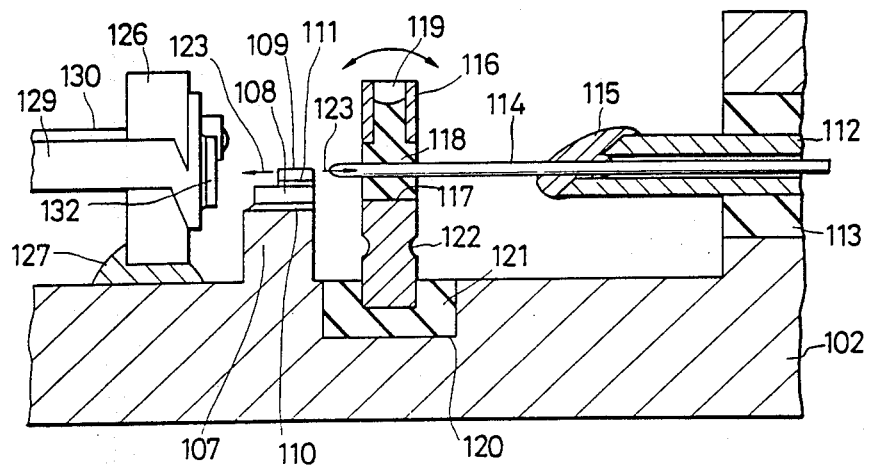
FIG. 22 is a sectional view showing the essential portion of a semiconductor laser device, in a seventh embodiment, according to the present invention.

As shown in FIG. 22, the free end of the optical fiber 114 projecting from the inner end of the fiber guide 112 is passed through the guide hole 117 of the positioning and fixing pin 116 and is fixed to the positioning and fixing pin 116 by solder 118. In soldering the optical fiber 114 to the positioning and fixing pin 116, the solder 118 is poured into a filling hole 119 formed in the central portion of the upper portion of the positioning and fixing pin 116. The positioning and fixing pin 116 is fixed to the stem 102 by the heat insulating member 21 formed of covar glass filled in a recess 120 formed in the main surface of the stem 102. The lower portion of the positioning and fixing pin 116 is constricted partly to form a narrow part 122 so that the positioning and fixing pin 116 can be comparatively easily bent when an external force is applied to the upper end of the positioning and fixing pin 116. In aligning the respective optical axes of the laser diode chip 109 and the optical fiber 114, the laser diode chip 109 is driven and the positioning and fixing pin 116 is bent to adjust the position of the same so that the intensity of the laser light received by the optical fiber 114 becomes the highest. Since the configuration of the positioning and fixing pin 116 enables easy bending of the same, the optical axes of the laser diode chip 109 and the optical fiber 114 are aligned highly accurately.

Referring to FIG. 23, one of the pair of leads 105 for the laser diode chip 109 penetrates the stem 102 and is fixed to the stem 102 by an insulating member 124. The inner end of this lead 105 is connected electrically to the upper electrode of the laser diode chip 109 by a wire 125. The other lead 105 is fixed directly to the stem 102. Thus, the latter lead 105 is connected electrically through the stem 102 and the submount 108 to the lower electrode of the laser diode chip 109. A predetermined voltage is applied across the pair of leads 105 to make the laser diode chip 109 to emit laser light from the opposite light emitting surfaces thereof.

The other pair of leads 105 penetrate one side of the stem 102 opposite the side of the same through which the fiber guide 112 extends. The respective extremities of the leads 105 are located opposite to a ceramic block 126. The ceramic block 126 is fixed to the main surface of the stem 102 by solder 127. The leads 105 are connected to terminal plates 129 and 130 electrically connected to conductive layers formed over the main surface and a side surface of the ceramic block 126, respectively, by a brazing filler metal 131. A light receiving element (photodiode chip) 132 is fixed to the terminal plate 129, while the electrode of the light receiving element 132 is connected electrically to the other terminal plate 130 by a wire 133. The output signal of the light receiving element 132 is provided on the pair of leads 105. The pair of leads 105 are insulated from the stem 102 by insulating members 134, respectively.

When a predetermined voltage is applied across the leads 105 for the laser diode chip 109, laser light 123 is emitted from the light emitting surfaces of the laser diode chip 109 as indicated by arrows in FIG. 22. Optical information represented by the laser light 123 is transmitted through the optical fiber cable 104 to a desired place. The light receiving element 132 continuously monitors the intensity of the laser light and the output level of the laser diode chip 109 is controlled at a fixed value.

This semiconductor laser device provides the following effects.

(1) Since the fiber guide and the positioning and fixing pin for fixedly holding the optical fiber are fixed to the stem by the insulating members formed of covar glass having a low thermal conductivity to suppress heat transfer from the fiber guide and the positioning and fixing pin to the stem in locally heating the fiber guide and the positioning and fixing pin for soldering the optical fiber thereto, the fiber guide and the positioning and fixing pin can be locally heated by a very small soldering iron or by a laser beam to a temperature appropriate for soldering, so that soldering can be satisfactorily completed in a short time.

(2) Since heat is transferred scarcely from the positioning and fixing pin to the stem, as mentioned in article (1), in soldering the optical fiber to the positioning and fixing pin after the respective optical axes of the laser diode chip and the optical fiber have been aligned, the relative position between the laser diode chip and the optical fiber remains as adjusted, so that the optical fiber is positioned highly accurately.

(3) Owing to the effects mentioned in articles (1) and (2), the reproducibility and reliability of the semiconductor laser device are improved, the semiconductor laser device is assembled highly accurately and the semiconductor laser device is manufactured at a low manufacturing cost.

Figure 24:
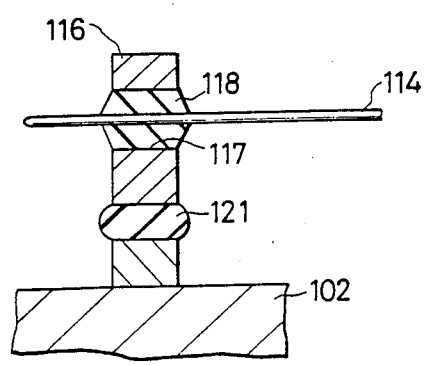
FIG. 24 is a sectional view showing the positioning pin for positioning and fixing the optical fiber of a modification of the semiconductor laser device of FIG. 22 according to the present invention.

The positioning and fixing pin 116 for holding the optical fiber 114 may be such a positioning and fixing pin 116 as shown in FIG. 24. The positioning and fixing pin 116 shown in FIG. 24 consists of two separate parts, namely, one part holding the optical fiber 114 and the other part attached to the stem 102, joined together by a heat insulating member 121.

Although the present invention has been described in its preferred embodiments as applied to photoelectric devices for optical communication, the present invention is not limited thereto in application and may be applied, for example, to optical integrated circuits for optical communication, measuring equipments incorporating light emitting diodes, and electronic equipments requiring local heating of the components for assembling, and it is to be understood to those skilled in the art that many changes and variations are possible in the invention without departing from the scope and spirit thereof.

What is claimed is:

1. A photoelectric device mounted in a box shaped package comprising:
   a central recess formed by walls extending from a bottom wall and lid covering the recess:
   an optical fiber cable passing through a fiber guard in one wall into the recess;
   a plurality of first leads extending through the walls of said package, said first leads being aligned in a row and having a portion which is outside of said housing wall and a portion which is positioned in the recess for connection to leads on said photoelectric source by ultrasonic bonding;
   a plurality of second leads corresponding to said first leads, each of said second leads being connected to said portion of the corresponding first lead which is outside of said housing wall by welding;

said second leads having a diameter adapted to fit into a socket and providing a first rigidity against vibration that may occur during ultrasonic bonding and at least the portions of said first leads positioned in said recess having a diameter which is greater than that of the second leads and a second rigidity against vibration that may occur during ultrasonic bonding which is greater than the first rigidity.

2. A photoelectric device as defined in claim 1 further comprising reinforcing plate means located in said recess of a plurality of said first leads and fixed to the wall being adjacent to said first leads to restrict vibration of the portion in the recess of said first lead portions in contact with said reinforcing plate.

3. A photoelectric device as defined in claim 2 wherein the reinforcing plate is made of a ceramic material having a metal plating and is soldered to a plural number of said first leads.

4. A photoelectric device as defined in claim 1 wherein said portion of the first lead which is outside of said housing wall has a diameter which is the same as that of said portion of the first lead which is positioned in the recess.

5. A photoelectric device as defined in claim 4 wherein said first lead is fixed to a wall of a hole formed in said bottom wall.

6. A photoelectric device as defined in claim 1 wherein one end of said second lead is welded at one end of said first lead.

7. A photoelectric device having two parts, one of said parts being a source of heat comprising a light emitting chip and the other part being an optical fiber mounted in a light transmitting relationship with said chip, said device including a base upon which both of said parts are mounted and a box shaped package enclosing said chip and part of said optical fiber, said device further comprising:

a central recess formed by walls extending from a bottom wall and lid covering the recess:

an optical fiber cable passing through a fiber guard in one wall into the recess;

a plurality of first leads extending through the walls of said package, said first leads being aligned in a row and having a portion which is outside of said housing wall and a portion which is positioned in the recess for connection to leads on said photoelectric source by ultrasonic bonding;

a plurality of second leads corresponding to said first leads, each of said second leads being connected to said portion of the corresponding first lead which is outside of said housing wall by welding; and means for supporting one of said parts on a member made of a conductive material including a heat insulating member positioned between said based and said member made of a conductive material, the other part being supported in a heat conducting relationship with said base.

8. The device as defined in claim 7 wherein the optical fiber is soldered to said member made of conductive material and wherein said last mentioned member serves as a means for positioning and maintaining the position of said fiber at a location to receive light emitted from said chip and be insulated from the heat generated by said chip.

9. The device as defined in claim 8 further having a wall extending from said base, a through aperture in said wall, and an optical fiber guide sleeve surrounded by a second sleeve, said second sleeve being made of heat insulation material and positioned in said aperture; and wherein said optical fiber extends through said guide sleeve.

10. The device as defined in claim 7 wherein the light emitted from said chip is laser light, the support means includes a fixing pin that extends from said base and includes said insulation member, and said optical fiber is secured at a first position to said fixing pin and at a second position remote from said chip by a support wall extending from said base.

11. The device as defined in claim 10 wherein said optical fiber has a metal coating at a position near said fixing pin and is connected to said fixing pin by solder.

12. A photoelectric device having two parts mounted in a box shaped package, one of said parts being a source of heat comprising a laser light emitting chip and the other part being an optical fiber mounted in a light transmitting relationship with said chip, said package comprising:

a base upon which both of said parts are mounted;

a central recess formed by walls extending from one side of said base and a lid covering said recess;

a fiber guard extending through one of said walls and having a central opening through which said optical fiber passes;

a fixing pin made of conductive material supported from said based and including a heat insulation portion positioned between said base and the conductive material of said pin;

support means including said fixing pin for fixing and maintaining a free end of said optical fiber in a light transmitting relationship with said chip;

a plurality of first leads extending through the walls of said package, said first leads being aligned in a row and having a portion which is outside of said housing wall and a portion which is positioned in the recess for connection to leads on said photoelectric source by ultrasonic bonding.

* * * * *